(12) United States Patent
Ehlen (10) Patent No.: US 8,842,432 B2
(45) Date of Patent: Sep. 23, 2014

(54) ARRANGEMENT OF COMPUTING ASSETS IN A DATA CENTER

(71) Applicant: Jon Brian Ehlen, Milpitas, CA (US)

(72) Inventor: Jon Brian Ehlen, Milpitas, CA (US)

(73) Assignee: Facebook, Inc., Menlo Park, CA (US)

( * ) Notice: Subject to any disclaimer, the term of this patent is extended or adjusted under 35 U.S.C. 154(b) by 217 days.

(21) Appl. No.: 13/624,909

(22) Filed: Sep. 22, 2012

(65) Prior Publication Data

US 2014/0085812 A1    Mar. 27, 2014

(51) Int. Cl.
G06F 1/20 (2006.01)
G06F 1/18 (2006.01)
H05K 7/20 (2006.01)
H05K 1/14 (2006.01)

(52) U.S. Cl.
CPC *G06F 1/20* (2013.01); *G06F 1/189* (2013.01); *H05K 1/14* (2013.01); *H05K 7/20* (2013.01)
USPC ............ 361/679.49; 361/679.5; 361/690; 361/693; 361/694; 361/695; 165/80.2; 165/80.3; 165/104.33; 165/122; 454/184

(58) Field of Classification Search
CPC ............... G06F 1/20; G06F 1/18; H05K 7/20; H05K 1/14; H05K 1/141; H01L 23/367; H01L 23/467
USPC .......... 361/679.31, 679.46–679.52, 690–696, 361/715, 716, 721, 724–727, 788, 796, 797, 361/831; 165/80.2, 80.3, 80.4, 104.33, 185, 165/121–126; 454/184, 906; 312/223.1, 312/223.2, 223.3, 236; 439/61, 65, 74, 75, 439/28, 60; 174/50.51, 52, 260
See application file for complete search history.

(56) References Cited

U.S. PATENT DOCUMENTS

| | | | | |
|---|---|---|---|---|
| 3,434,014 A | * | 3/1969 | Taynton | 361/695 |
| 3,942,586 A | * | 3/1976 | Fries | 165/104.33 |
| 4,679,872 A | * | 7/1987 | Coe | 439/61 |
| 4,967,155 A | * | 10/1990 | Magnuson | 324/212 |
| 5,060,111 A | * | 10/1991 | Takashima | 361/695 |
| 5,063,475 A | * | 11/1991 | Balan | 361/679.49 |
| 5,150,279 A | * | 9/1992 | Collins et al. | 361/679.53 |
| 5,289,694 A | * | 3/1994 | Nordin | 62/259.2 |
| 5,546,315 A | * | 8/1996 | Kleinschnitz | 700/218 |
| 5,716,220 A | * | 2/1998 | Siroky | 439/61 |
| 5,735,587 A | * | 4/1998 | Malin et al. | 312/305 |
| 5,889,651 A | * | 3/1999 | Sasaki et al. | 361/699 |
| 5,903,432 A | * | 5/1999 | McMahon | 361/690 |
| 6,665,182 B2 | * | 12/2003 | Hogerl | 361/695 |
| 6,690,584 B2 | * | 2/2004 | Uzuka et al. | 361/796 |
| 7,046,513 B2 | * | 5/2006 | Nishiyama et al. | 361/695 |
| 7,221,572 B2 | * | 5/2007 | Arippol | 361/724 |
| 7,395,133 B2 | * | 7/2008 | Lowe | 700/218 |

(Continued)

*Primary Examiner* — Michail V Datskovskiy
(74) *Attorney, Agent, or Firm* — Fenwick & West LLP (57) ABSTRACT

A system of computing assets arranges a plurality of backplanes to form a perimeter of a central region of a backplane structure. A plurality of computing assets are coupled to the backplanes and extend away from the central region of the backplane structure. A plurality of air intake openings are located along the perimeter of the backplane structure. An exhaust duct is coupled to an exhaust opening of the backplane structure and configured to direct air away from the backplane structure and is coupled to an air moving device. When the air moving device is operational, air flows across the computing assets through the air intake openings towards the central region of the backplane structure and into the exhaust duct, which directs the air away from the backplane structure.

19 Claims, 5 Drawing Sheets

(56) References Cited

U.S. PATENT DOCUMENTS

| | | | |
|---|---|---|---|
| 7,435,097 B2 * | 10/2008 | Mecker | 439/65 |
| 7,643,285 B2 * | 1/2010 | Nishiyama et al. | 361/679.49 |
| 7,679,908 B2 * | 3/2010 | Yeh et al. | 361/695 |
| 7,724,515 B2 * | 5/2010 | Fukuda et al. | 361/679.5 |
| 7,819,667 B2 * | 10/2010 | Kowalski et al. | 439/65 |
| 8,189,345 B2 * | 5/2012 | Rapp et al. | 361/797 |
| 8,331,088 B2 * | 12/2012 | Miyamoto et al. | 361/679.5 |
| 2004/0213651 A1 * | 10/2004 | Malin | 414/331.05 |
| 2007/0053154 A1 * | 3/2007 | Fukuda et al. | 361/687 |
| 2012/0281350 A1 * | 11/2012 | Tanaka et al. | 361/679.33 |

\* cited by examiner

ARRANGEMENT OF COMPUTING ASSETS IN A DATA CENTER

BACKGROUND

1. Field of Disclosure

The present disclosure relates to arranging computing assets in a data center.

2. Description of Related Art

Data centers include a large number of computing assets that generate a significant amount of heat. To ensure proper cooling of the computing assets, data centers may arrange the computing assets into a hot aisle/cold aisle layout. In a hot aisle/cold aisle layout, computing assets are placed into equipment racks that are arranged so that the fronts of the racks face each other. An air conditioning unit feeds cold air into an aisle that the rack fronts face to create a cold aisle. The backs of the equipment racks also face each other, creating hot aisles. The air from the hot aisles may be cooled and re-circulated into the cold aisles.

Although the hot aisle/cold aisle layout has become popular in many modern data centers, the hot aisle/cold aisle layout is space inefficient and limits the density of computing assets in the data center. For example, each equipment rack has multiple rack-posts creating gaps between adjacent racks that cannot be filled with computing assets. As another example, each equipment rack includes a large number of fans located along the back or the front of the rack to move air from the cold aisle into the hot aisle. The fans also occupy a significant amount of space that cannot be filled with any computing assets.

SUMMARY

Embodiments of the present disclosure include a system with a space-efficient arrangement of computing assets that increases the density of computing assets while cooling the computing assets. In one embodiment, a plurality of backplanes form a perimeter of a central region of a backplane structure. A plurality of computing assets are coupled to the backplanes and extend away from the central region of the backplane structure. For example, the backplane structure is cylindrical and the computing assets extend radially away from an axis of the cylinder when coupled to the backplanes. A plurality of air intake openings are located along the perimeter of the backplane structure. For example, the air intake openings are between pairs of backplanes or may be included within one or more backplanes. An exhaust duct is coupled to an exhaust opening of the backplane structure and configured to direct air away from the backplane structure and is coupled to an air moving device. When the air moving device is operational, air flows across the computing assets through the air intake openings towards the central region of the backplane structure and into the exhaust duct, which directs the air away from the backplane structure.

The features and advantages described in this disclosure and in the following detailed description are not all-inclusive, and particularly, many additional features and advantages will be apparent to one of ordinary skill in the relevant art in view of the drawings, specification, and claims hereof.

The figures depict embodiments of the present disclosure for purposes of illustration only. One skilled in the art will readily recognize from the following description that alternative embodiments of the structures and methods illustrated herein may be employed without departing from the principles, or benefits touted, of the disclosure described herein.

DETAILED DESCRIPTION

System Overview

Figure 1:
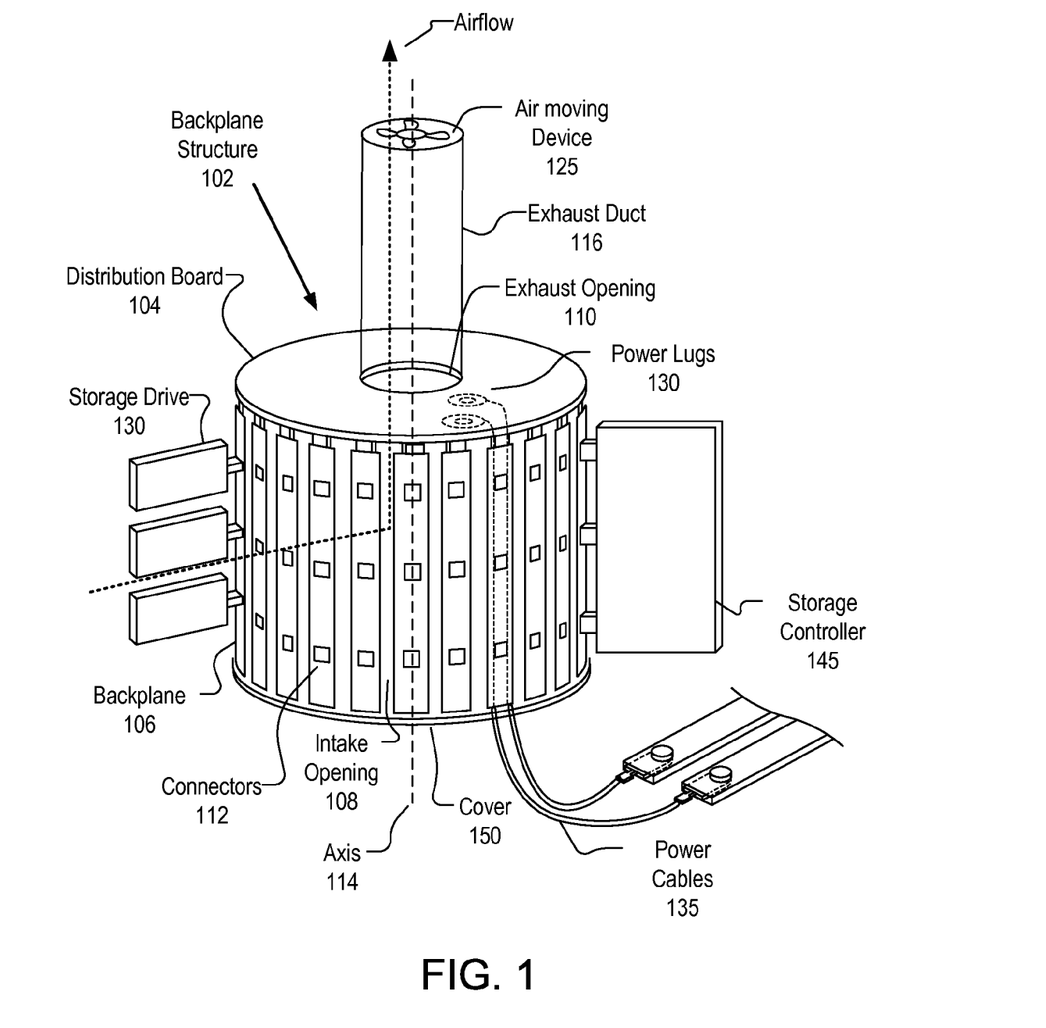
FIG. 1 is a system for cooling computing assets, according to an embodiment.

FIG. 1 is one embodiment of a system for computing asset cooling. The system may be found in a data center or other type of information technology facility. The system includes a backplane structure 102 to which computing assets are connected. The backplane structure 102 arranges the computing assets in a space efficient configuration while allowing the computing assets to be easily cooled. Computing assets may include any type of electrical equipment that is used in a computing environment. Examples of computing assets include storage drives (e.g. hard drives, solid state drives), storage controllers, computer servers and networking equipment.

The backplane structure 102 includes a distribution board 104, multiple backplanes 106, multiple air intake openings 108 and an exhaust opening 110 that together form a three dimensional shape. In the example of FIG. 1, the backplane structure 102 has a cylindrical shape having a hollow cavity in the central region of the cylinder. As shown in FIG. 1, the axis 114 denotes the approximate center of backplane structure 102. The distribution board 104 forms an upper base of the backplane structure 102 while the backplanes 106 surround the central region of the backplane structure 102 and form the perimeter of the backplane structure 102.

As used herein, "cylindrical" may include both perfect cylinders as well as substantially cylindrical shapes that resemble that of a cylinder. One example of a substantially cylindrical shape is a geometric prism having a large number of faces (e.g. greater than or equal to 8 faces). A geometric prism is a polyhedron with n-sided polygonal bases and n faces connecting the bases. The backplane structure 102 in FIG. 1 may be a prism because each of the backplanes 106 is likely to be a flat, planar backplane. In other embodiments the backplane structure 102 may be in a different shape so long as the backplane structure 102 has an empty central region so that air can be drawn into the backplane structure 102. Examples include half cylinders and geometric prisms having a low number of faces (e.g. less than 8 faces), such as rectangular and triangular prisms.

The distribution board 104 forms a base of the backplane structure 102 and is perpendicular to the axis 114 of the backplane structure. The distribution board 104 includes power lugs 103 connected to a set of power cables 135. The distribution board 104 receives power through the set of power lugs 130 and distributes the power to the individual backplanes 106. In some embodiments, the distribution board 104 also includes signaling connections allowing the individual backplanes to communicate with each other. For example, the distribution board 104 is a printed circuit board (PCB) including metal traces distributing power and signaling information to backplanes 106.

The individual backplanes 106 are coupled to the distribution board 104 in a manner so that they are parallel to the axis 114 of the backplane structure 102 and form the perimeter of the backplane structure 102. Similar to the distribution board 104, the individual backplanes 106 may be PCBs including metal traces for distributing power and signaling information from the distribution board 104 to electrical connectors 112 of the backplanes 106. The electrical connectors 112 are located on the outside face of the backplanes 106 and are configured to carry power and signaling information to computing assets (e.g., storage drive 130 and storage controller 145) that are coupled to the electrical connectors 112.

When coupled to the backplanes 106 via the connectors 112, the computing assets (e.g., storage drive 130, storage controller 145) extend outwards from the backplane structure 102. In other words, an end of a computing asset connected to the backplane structure 102 is closer to the central region of the backplane structure 102 than an opposite end of the computing asset. For example, as shown in FIG. 1, the computing assets may extend outwards from the axis 114 of the backplane structure 102 in a radial direction (e.g., along the same direction as a radius of the backplane structure 102). In other embodiments, the computing assets extend outwards from a central region of the backplane structure 102 without extending precisely in the radial direction.

The majority of computing assets coupled to the backplane structure 102 may be storage drives 130, creating a dense storage array. The storage drives 130 communicate with a network or server (not shown) via the storage controller 145. In one embodiment, a variety of types of computing assets, such as storage drives, servers and networking equipment, may be connected to a single backplane structure 102.

The backplane structure 102 also includes air intake openings 108 located around the perimeter of the backplane structure 102. In FIG. 1, the air intake openings 108 are located between adjacent pairs of backplanes 106. In other embodiments, the air intake openings 108 may be openings in the backplanes 106 themselves. The distribution board 104 also includes an air exhaust opening 110. An exhaust duct 116 is coupled to the air exhaust opening 110 and is configured to direct air away from the backplane structure 102.

An air moving device 125 (e.g., a fan) is coupled to the air exhaust opening 110 through the exhaust duct 116. When the air moving device 125 is operating, air is pulled across the computing assets and into the center of the backplane structure 102 through the intake openings 108. The moving air extracts heat from the computing assets and the airflow directs the extracted heat away from the computing assets. Air heated by the computing assets is directed to the center of the backplane structure 102 and out of the backplane structure 102 through the exhaust opening 110. Hence, the airflow draws cold air across the surface of computing assets through the gaps between the computing assets, absorbing heat generated by the computing assets and cooling the computing assets. The heated air is directed through the air exhaust opening 110, where it can be recycled back into cold air or released outside of the data center.

The arrangement of electrical assets shown in FIG. 1 allows for a high density of computing assets while allowing the computing assets to be efficiently cooled. For example, moving air across many computing assets using a central air moving device 125 reduces the space occupied by the fans, rather than by computing assets, in conventional configurations. While increasing the density of computing asset storage, the system 100 allows the computing assets to be efficiently cooled by drawing cold air from the outside of the backplane structure 102 and expelling the hot air through the exhaust duct 116.

In one embodiment, the backplane structure 102 has a rotisserie configuration that allows the backplanes 106 and computing assets can be rotated around the axis 114 of the backplane structure 102. This configuration increases the accessibility of the computing assets. For example, when the backplane structure 102 is mounted into an equipment rack, the rotisserie configuration allows an administrator of a data center to more easily replace computing assets connected to the backplane structure 102.

In another embodiment, a lower base of the backplane structure 102 may be covered with a solid cover 150, blocking airflow through the bottom of the backplane structure 102. The solid cover 150 air to be drawn into the backplane structure 102 through the air intake openings 108, increasing the airflow across the computing assets attached to the backplane structure 102. In some embodiments, the solid cover 150 covering the lower base of the backplane structure 102 may include an additional intake opening that may be coupled to the exhaust opening of other backplane structures 102 allowing multiple backplane structures 102 to share a common exhaust duct, as will be explained in conjunction with FIGS. 4 and 5.

Figure 2:
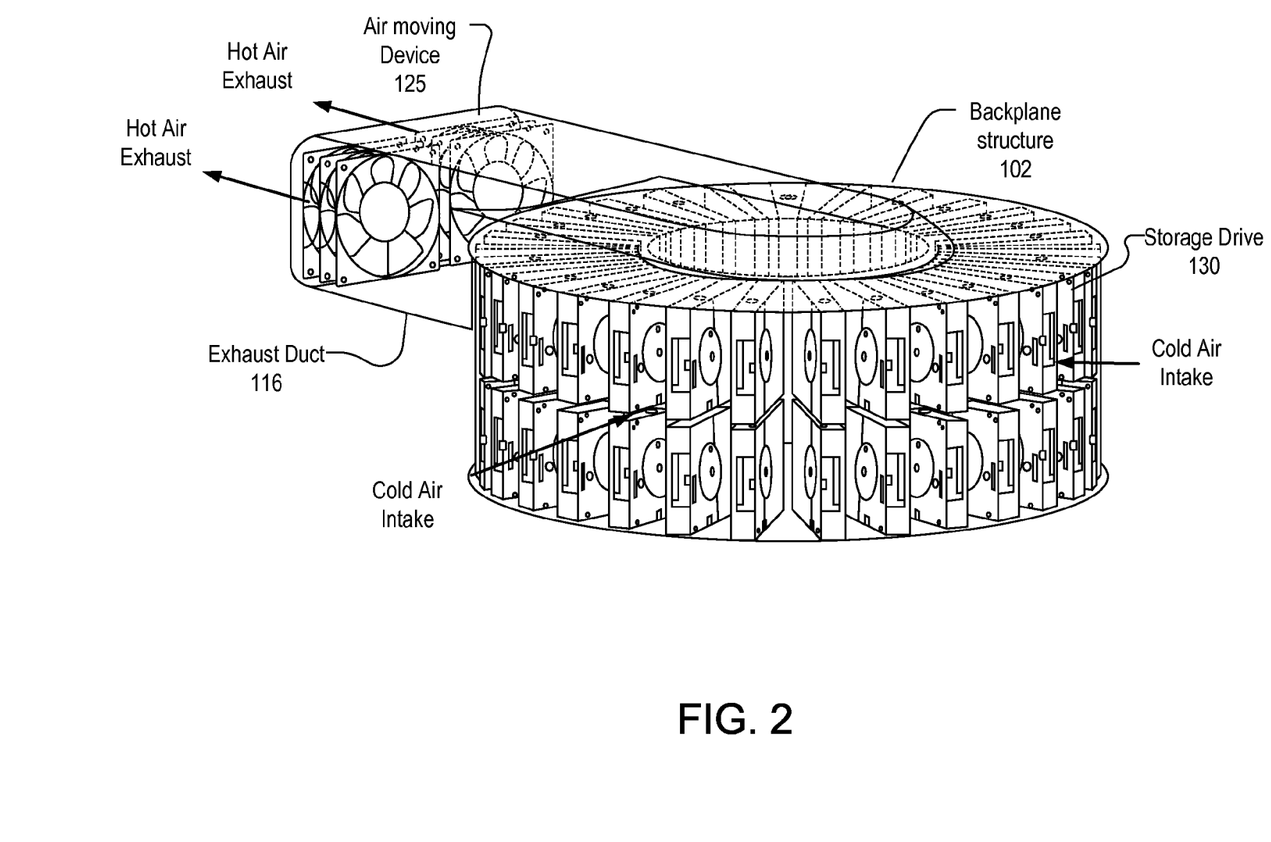
FIG. 2 is a system for cooling computing assets, including a backplane structure filled with the computing assets, according to an embodiment.

FIG. 2 is a system for computing asset cooling including a backplane structure 102 filled with computing assets. The system shown by FIG. 2 is similar to the system in FIG. 1, but has a backplane structure 102 filled with storage drives 130, obscuring the view of much of the backplane structure 102. In the system of FIG. 2, the exhaust duct 116 is perpendicular to an axis of the backplane structure 102.

In the system of FIG. 2, like the system shown by FIG. 1, an air moving device 125 draws cold air across the storage drives 130 into the center of the backplane structure 102. This airflow cools the storage drives 130 and causes hot air to collect in the center of the backplane structure 102. The hot air is then drawn out of the backplane structure 102 through the exhaust duct 116.

Figure 3:
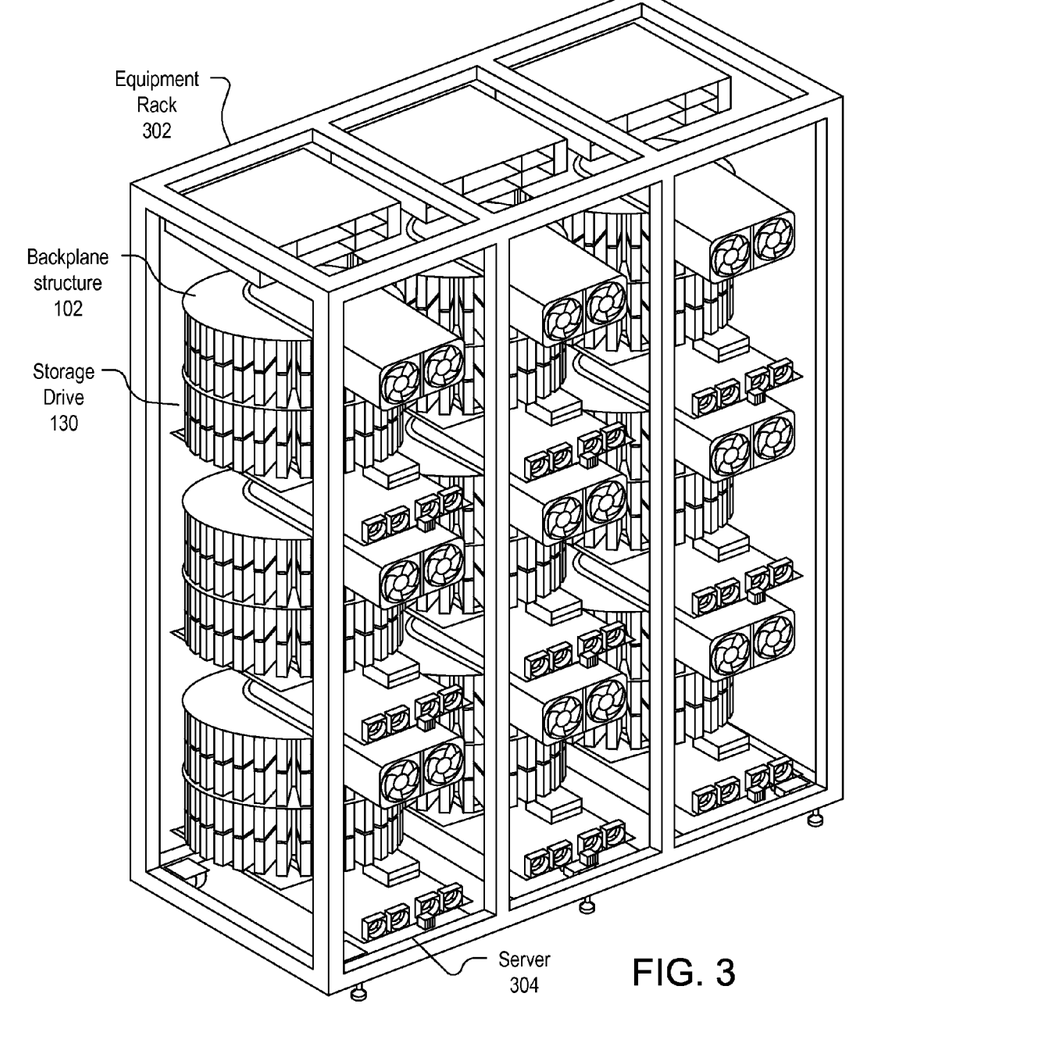
FIG. 3 is a system for cooling computing assets, including multiple backplane structures arranged into an equipment rack, according to an embodiment.

FIG. 3 illustrates a system for asset cooling including multiple backplane structures 102 arranged into an equipment rack 302. The equipment rack 302 may be located in a data center and cooled with cold air provided by an air conditioning unit of the data center. In the system of FIG. 3, the equipment rack 302 includes three rows of backplane structures 102 including storage devices 130 and/or other computing assets. Servers 304 are positioned below each backplane structure 102 in the equipment rack 302. However, in other embodiments, the servers 304 may be located in any suitable location within the equipment rack 302. In one embodiment, the storage drives 130 in a backplane structure 102 are managed by a server 304 proximate to the backplane structure, such as the server 304 located below the backplane structure 102. Other arrangements of computing assets and backplane structures 102 in the equipment rack 302 are also possible. For example, a column within the equipment rack 302 may include servers 302 rather than backplane structures 102.

Figure 4:
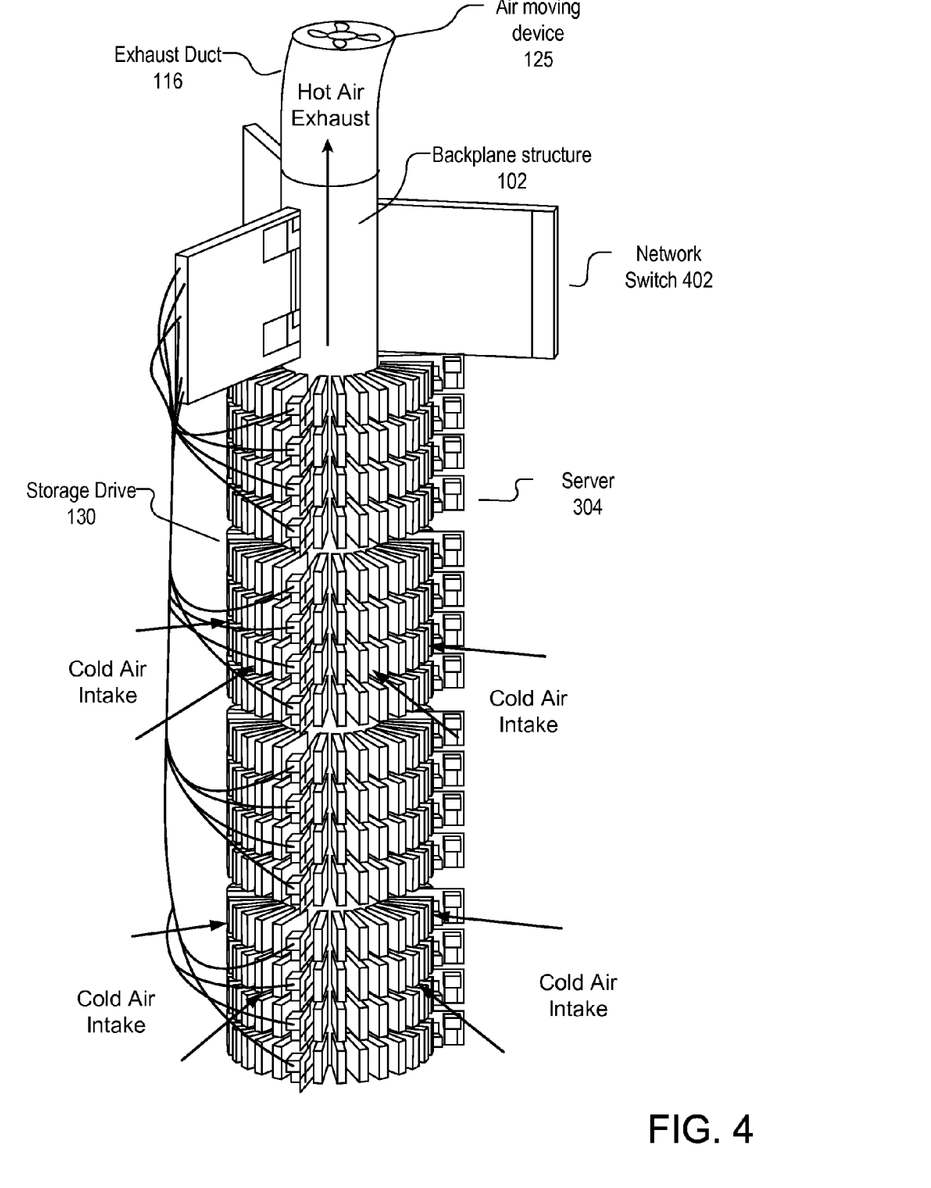
FIG. 4 is a system for cooling computing assets, including multiple backplane structures sharing a common exhaust duct, according to an embodiment.

FIG. 4 is a system for cooling computing assets that includes multiple backplane structures 102 sharing a common exhaust duct 116. In the example of FIG. 4, multiple backplane structures 102 have a common axis, forming a tubular trunk extending through each of the backplane structures 102. In FIG. 4, a topmost backplane structure 102 is connected to one or more network switches 402 to communicate data from the computing assets in other backplane structures 102 in the system to other devices. As shown in FIG. 4, additional backplane structures 102 in the system below the topmost backplane structure 102 include computing assets, such as storage drives 130 and servers 150.

In the system, the exhaust opening at the top of each backplane structure 102 is connected to an intake opening at the bottom of the next adjacent backplane structure 102, forming a common exhaust duct 116 shared between all backplane structures 102 in the system. Hence, an air moving device 125, such as a fan, may be used to draw air across computing assets included in each of the backplane structures 102. When the air moving device 125 operational, it draws cold air across the computing assets (e.g., storage devices 130, servers 304, network switches 402) of each of the backplane structures 102 into the common exhaust duct 116 in the center of the backplane structures 102, which directs the air out of the backplane structures 102.

Figure 5:
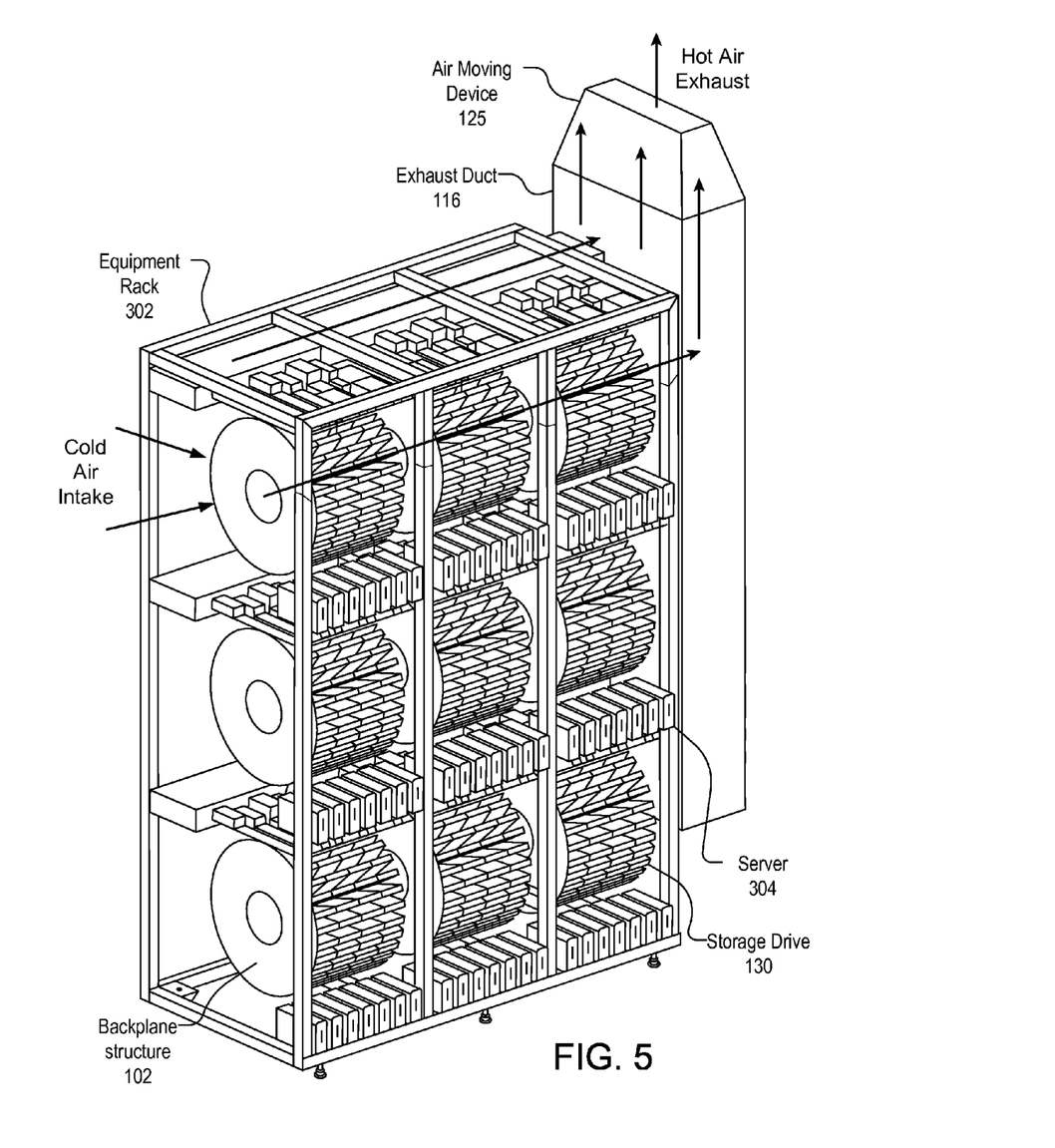
FIG. 5 is a system for cooling computing assets, including multiple backplane structures in an equipment rack that share a common exhaust duct, according to an embodiment.

FIG. 5 is a system for cooling computing assets include including multiple backplane structures 102 sharing a common exhaust duct 116 in an equipment rack 302. As shown in FIG. 5, the equipment rack 302 holds multiple rows of backplane structures 102 filled with storage drives 130 and/or other computing assets. Each row includes one or more backplane structures 102 and the exhaust opening of each backplane structure 102 is coupled to an intake opening of an adjacent backplane structure 102. The last backplane structure in each row 102 is coupled to the common exhaust duct 116. Hence, the rows of backplane structures 102 share the same exhaust duct 116 and air moving device 125.

When the air moving device 125 is powered on, air is drawn across the computing assets of the backplane structures 102 and into the common exhaust duct 116 for direction away from the backplane structures. In one embodiment, rows of servers 304 are positioned between the rows of backplane structures 102. Exhaust outputs of the servers 304 are also coupled to the common exhaust duct 116 to direct hot air generated by the servers 304 away from the servers 304.

In one embodiment, the equipment rack 302 is located within a data center that not cooled using a hot aisle/cold aisle layout. For example, the entire data center is cooled to a desired temperature so cold air surrounds the equipment rack 302. The cold air is drawn into the backplane structures 102 and the servers 304 for absorbing heat generated by computing assets and the servers 304. The air moving device 125 then draws the resulting hot air away from the backplane structures and servers 304 via the common exhaust duct 116.

SUMMARY

The foregoing description of the embodiments of the disclosure has been presented for the purpose of illustration; it is not intended to be exhaustive or to limit the disclosure to the precise forms disclosed. Persons skilled in the relevant art can appreciate that many modifications and variations are possible in light of the above disclosure.

The language used in the specification has been principally selected for readability and instructional purposes, and it may not have been selected to delineate or circumscribe the inventive subject matter. It is therefore intended that the scope of the disclosure be limited not by this detailed description, but rather by any claims that issue on an application based hereon. Accordingly, the disclosed embodiments are intended to be illustrative, but not limiting, of the scope of the disclosure, which is set forth in the following claims.

What is claimed is:

1. A system comprising:
   a plurality of backplanes arranged to form a perimeter of a cylindrical backplane structure, the plurality of backplanes surrounding a central axis of the cylindrical backplane structure and positioned parallel to the central axis;
   a plurality of computing assets coupled to the backplanes and extending radially away from the central axis of the cylindrical backplane structure;
   a plurality of air intake openings located along the perimeter of the cylindrical backplane structure and between pairs of the backplanes that form the perimeter of the cylindrical backplane structure;
   an exhaust duct coupled to an exhaust opening of the backplane structure and configured to direct air away from the cylindrical backplane structure; and
   an air moving device coupled to the exhaust duct, the air moving device arranged to cause an airflow across the computing assets through the air intake openings towards the central axis of the backplane structure and into the exhaust duct.

2. The system of claim 1, wherein the computing assets comprise storage drives.

3. The system of claim 1, wherein the air moving device comprises a fan.

4. A system comprising:
   a plurality of backplanes arranged to form a perimeter surrounding a central region of a backplane structure;
   a plurality of computing assets coupled to the backplanes and extending away from the central region of the backplane structure;
   a plurality of air intake openings located along the perimeter of the backplane structure;
   an exhaust duct coupled to an exhaust opening of the backplane structure and configured to direct air away from the backplane structure; and
   an air moving device coupled to the exhaust duct, the air moving device configured to cause an airflow across the computing assets through the air intake openings towards the central region of the backplane structure and into the exhaust duct.

5. The system of claim 4, wherein one or more air intake openings are positioned between pairs of the backplanes forming the perimeter surrounding the central region of the backplane structure.

6. The system of claim 4, wherein the backplane structure is cylindrical and the central region of the backplane structure is a central axis of the backplane structure.

7. The system of claim 6, wherein the computing assets extend radially away from the central axis of the backplane structure.

8. The system of claim 6, wherein the computing assets are rotatable around the central axis of the backplane structure.

9. The system of claim 6, wherein the backplanes are parallel to the central axis of the backplane structure.

10. The system of claim 4, wherein the backplane structure is half-cylindrical or prism shaped.

11. The system of claim 4, wherein the backplanes include electrical connectors, and the computing assets are coupled to the electrical connectors of the backplanes.

12. The system of claim 4, further comprising:
    a distribution board coupled to backplanes and to a power supply, the distribution board configured to provide power from the power supply to the backplanes and configured to provide and signaling connections to the backplanes, the exhaust duct coupled to an opening in the distribution board.

13. The system of claim 4, wherein the computing assets comprise storage drives.

14. The system of claim 4, wherein the computing assets comprise at least one of storage controllers, computer servers, or networking equipment.

15. The system of claim 4, wherein the air moving device comprises a fan.

16. The system of claim 4, further comprising:
a plurality of additional backplanes arranged to form a perimeter of a central region of an additional backplane structure;
a plurality of computing assets coupled to the additional backplanes and extending away from the central region of the additional backplane structure; and
a plurality of additional air intake openings located along the perimeter of the additional backplane structure,
wherein the air moving device is configured to cause an airflow across the additional computing assets through the additional air intake openings towards the central region of the additional backplane structure and into the exhaust duct.

17. The system of claim 16, wherein an opening of the backplane structure opposite to the exhaust opening of the backplane structure is coupled to an exhaust opening of the additional backplane structure.

18. The system of claim 16, wherein the exhaust duct is coupled to an exhaust opening of the additional backplane structure and configured to direct air away from the additional backplane structure.

19. A system comprising:
an equipment rack;
a backplane structure mounted within the equipment rack that includes a plurality of backplanes arranged to form a perimeter surrounding a central region of the backplane structure;
a plurality of computing assets coupled to the backplanes and extending away from the central region of the backplane structure;
a plurality of air intake openings located along the perimeter of the backplane structure;
an exhaust duct coupled to an exhaust opening of the backplane structure and configured to direct air away from the backplane structure; and
an air moving device coupled to the exhaust duct, the air moving device configured to cause an airflow across the computing assets through the air intake openings towards the central region of the backplane structure and into the exhaust duct.

* * * * *